(12) United States Patent
Takahashi et al.

(10) Patent No.: US 6,482,329 B1
(45) Date of Patent: Nov. 19, 2002

(54) METHOD FOR MANUFACTURING MAGNETORESISTANCE ELEMENT

(75) Inventors: Migaku Takahashi, 20-2, Hitokida 2-chome, Taihaku-ku, Sendai-shi, Miyagi-ken 982-02 (JP); Satoshi Miura, Miyagi-ken (JP); Masakiyo Tsunoda, Miyagi-ken (JP)

(73) Assignee: Migaku Takahashi, Sendai (JP)

( * ) Notice: Subject to any disclaimer, the term of this patent is extended or adjusted under 35 U.S.C. 154(b) by 0 days.

(21) Appl. No.: 09/381,822

(22) PCT Filed: Mar. 28, 1997

(86) PCT No.: PCT/JP97/01091

§ 371 (c)(1),
(2), (4) Date: Dec. 18, 2000

(87) PCT Pub. No.: WO98/44521

PCT Pub. Date: Oct. 8, 1998

(51) Int. Cl.[7] ............... H01F 41/18; H01L 43/12
(52) U.S. Cl. ............... 216/22; 216/37; 216/67; 204/192.2; 134/21
(58) Field of Search ............... 216/22, 37, 67; 204/192.2; 134/21; 438/906

(56) References Cited

U.S. PATENT DOCUMENTS 4,462,881 A * 7/1984 Yamamoto et al. .... 204/192.15
5,666,247 A * 9/1997 Schultz .................... 240/192.2
6,024,885 A * 2/2000 Pendharkar et al. .......... 216/22
6,095,160 A * 8/2000 Chu ........................ 134/1.1
6,361,618 B1 * 3/2002 Nulman ...................... 134/19

FOREIGN PATENT DOCUMENTS

| JP | 5-234754 A | 9/1993 | ........... H01F/10/30 |
| JP | 6-244028 | 9/1994 | ........... H01F/10/14 |

* cited by examiner

*Primary Examiner*—Anita Alanko
(74) *Attorney, Agent, or Firm*—Randall J. Knuth

(57) ABSTRACT

A method of manufacturing a magnetoresistance element which can reproduce magnetic signals with higher sensitivity. The manufacturing method includes the steps of providing a vacuum below $10^{-9}$ Torr in a film forming chamber for forming a nonmagnetic layer and ferromagnetic layer; performing plasma-etching of the surface of a substrate body by using a mixture of a gas (a) containing at least oxygen or water introduced into the chamber and an Ar gas (b) introduced into the chamber in a vacuum, state controlled to higher than $10^{-9}$ Torr; and forming the nonmagnetic and ferromagnetic layers on the etched substrate body by sputtering a prescribed target by using the mixture of the gases (a) and (b).

3 Claims, 6 Drawing Sheets

METHOD FOR MANUFACTURING MAGNETORESISTANCE ELEMENT

TECHNICAL FIELD

The present invention relates to a method of manufacturing a magneto-resistance element, and in particular, to a method of manufacturing a magneto-resistance element having a large rate of change of magneto-resistance (MR). The magneto-resistance element made by the method of the present invention is suitably applied to a head for reproducing a magnetic signal written into a hard disk, floppy disk, magnetic tape, or the like.

BACKGROUND ART

Conventionally, as structure of a magneto-resistance, are widely known an artificial lattice type (A) of a structure in which ferromagnetic layers are laminated a plurality of times on a surface of a substrate body putting non-magnetic layers (spacers) between them, and a spin valve type (B) of a structure in which ferromagnetic layers are laminated on a surface of a substrate body putting non-magnetic layers between them and an antiferromagnetic layer is formed on the surface of said ferromagnetic layer provided last.

To manufacture the magneto-resistance element of such a structure, since each layer is an ultra thin film having thickness of several nm, technological development has been demanded for sequentially laminating high purity thin films superior in flatness, under an atmosphere as clean as possible. Japanese Patent Application No. 7-193882 is mentioned as an example of such technique. The specification of that patent application describes that by making oxygen concentration in the above described structure less than or equal to 100 wt ppm, a magneto-resistance element having a high MR ratio is obtained. Further, it reports that such structure having a trace of oxygen concentration is superior in flatness.

However, in the present state that higher recording density is being promoted, it is strongly desired to realize a magneto-resistance element that can reproduce a magnetic signal with higher sensitivity, i.e., a magneto-resistance element having a higher MR ratio (at room temperature) as compared to the conventional one. To accomplish it, it is desired to develop a manufacturing method that is superior in controllability and can easily form a magneto-resistance element that is better in its flatness of its lamination interfaces and has fewer defects in its crystal structure.

An object of the present invention is to provide a method of manufacturing a magneto-resistance element having such a high MR ratio that a magnetic signal can be reproduced with higher sensitivity.

DISCLOSURE OF THE INVENTION

The present invention provides a method of manufacturing a magneto-resistance element of a structure in which ferromagnetic layers are laminated a plurality of times on a surface of a substrate body putting non-magnetic layers therebetween, comprising steps of:

depressurizing an inside of a deposition chamber in which said non-magnetic layers and said ferromagnetic layers are formed, to an ultimate degree of vacuum at a level of $10^{-9}$ Torr or less;

introducing a gas a containing at least oxygen or water into said deposition chamber to change the ultimate degree of vacuum inside the deposition chamber to a certain pressure higher than the level of $10^{-9}$ Torr, then, introducing a gas b consisting of Ar, and carrying out plasma etching processing of the surface of said substrate body using a mixed gas of said gas a and said gas b; and sputtering prescribed targets in said deposition chamber using the mixed gas of said gas a and said gas b to form said non-magnetic layers and said ferromagnetic layers by a sputtering technique on the substrate body processed by said plasma processing.

In the method of manufacturing a magneto-resistance element according to the present invention, first, owing to the step of depressurizing the inside of the deposition chamber in which said non-magnetic layers and said ferromagnetic layers re formed to an ultimate degree of vacuum at a level of $10^{-9}$ Torr or less, it is possible to remove substances absorbed discontinuously onto the substrate body at atmospheric pressure, from the surface of the substrate body in the stage preceding the film formation.

Next, owing to the step of introducing the gas a containing at least oxygen or water into the deposition chamber to change the ultimate degree of vacuum inside the deposition chamber to the certain pressure higher than the level of $10^{-9}$ Torr, then, introducing the gas b consisting of Ar, and carrying out plasma etching processing of the surface of the substrate body using the mixed gas of said gas a and said gas b, it is possible to make a controlled amount of impurities such as oxygen be uniformly absorbed onto the surface of the substrate body from which impurities have been sufficiently removed in the step of degreasing the ultimate degree of vacuum to the level of $10^{-9}$ Torr or less.

Then, owing to the step of sputtering the prescribed targets in said deposition chamber using the mixed gas of said gas a and said gas b, to form said non-magnetic layers and said ferromagnetic layers by a sputtering technique on the substrate body processed by said plasma processing, it is possible to form a multi-layer film under an atmosphere that is controlled in its cleanliness although that cleanliness is low. By this, there are many impurities on the surface of the substrate body and on the surfaces of the films and it becomes difficult for crystals to grow, and accordingly, diameters of crystal grains become smaller. Accordingly, at the same time, the flatness of the lamination interfaces is improved. Or, the impurities act like a surface active agent to suppress aggregation of atoms constituting the non-magnetic layers and the ferromagnetic layers so that the interfaces are flattened. As a result, a magneto-resistance element having a high MR ratio is obtained.

Further, in the method of manufacturing a magneto-resistance element according to the present invention, by making the ultimate degree of vacuum inside the deposition chamber more than or equal to $3\times10^{-7}$ Torr and less than or equal $8\times10^{-5}$ Torr, after introducing said gas a, in said step of carrying out the plasma etching processing and said step of film formation by a sputtering technique, there is obtained a magneto-resistance element having a higher MR ratio than a magneto-resistance element obtained by depressurizing the inside of the deposition chamber to an ultimate degree of vacuum at a level of $10^{-9}$ Torr or less, etching the surface of the substrate body using only Ar gas, and then forming the non-magnetic layers and the ferromagnetic layers by a sputtering technique.

Further, when the ultimate degree of vacuum inside the deposition chamber is more than or equal to $3\times^{-6}$ Torr and less than or equal to $2\times10^{-5}$ Torr, after introducing said gas a, in said step of carrying out the plasma etching processing and said step of film formation by a sputtering technique, there is obtained a magneto-resistance element having an MR ratio twice as high as the magneto-resistance element obtained by depressurizing the inside of the deposition chamber to the ultimate degree of vacuum at the level of $10^{-9}$ Torr or less, etching the surface of the substrate body using only Ar gas, and then forming the non-magnetic layers and the ferromagnetic layers by a sputtering technique.

EMBODIMENTS OF THE INVENTION

As a film-formation apparatus suitable for carrying out the method of manufacturing a magneto-resistance element according to the present invention, is mentioned a facing target DC sputtering system (made by Osaka Vacuum, Ltd.) shown in FIGS. 5 and 6, for example. FIG. 5 is a system diagram showing a vacuum pumping system of the apparatus, and FIG. 6 is a schematic cross section of the inside of a sputtering chamber of the apparatus shown in FIG. 5, seen from above. In FIG. 5, reference numeral 501 refers to a load-lock chamber, 502 to the sputtering chamber, 503 to a gate valve, 504 to a means for moving a substrate body, 505 to a turbo-molecular pump, 506 to a scroll vacuum pump, 507 to an auxiliary valve, 508 to a leak valve, 509a to a variable leak valve, 510 to a high purity $N_2$ gas supply line, 511 to a composite molecular pump, 512 to a molecular drag pump, 513 to a scroll vacuum pump, 514 to an ion gauge, 515 to a Pirani gauge, 516 to an auxiliary valve, 517 and 518 to leak valves, 519 to a variable leak valve, and 520 and 521 to high purity Ar gas supply lines.

In FIG. 6, a reference numeral 601 refers to a substrate body, 602 to a substrate body holder, 603 to a Co deposition chamber, 604 to a Cu deposition chamber, 605a and 605b to shutters, 606a and 606b to anti-adhesion plates, 607 to a Co target, 608 to a magnet, 609 to a Cu target, 610 to a magnet, 611 to an AC power supply, 612 and 613 to DC power supplies, and 614 and 615 to cathodes.

In the facing target sputtering system such as shown in FIGS. 5 and 6, two planar targets of the same size are arranged to face each other, and permanent magnets are arranged within a cathode so that a plasma focusing magnetic field is applied perpendicularly to a target. Both targets functions as reflecting electrodes for a high speed γ electron (secondary electron) emitted from a target and accelerated in a cathode fall, and thereby, this secondary electron is confined between both targets and secondary electron impact on the substrate body arranged outside the area between the targets is suppressed. Further, while the secondary electrons are reciprocating within a space, they raise energy of electrons within the plasma, or, by colliding with the atmospheric gas, they promote ionization of the gas and develop high density plasma. Owing to thus-described characteristics, it is advantageous in that a rise in substrate temperature during film formation can be reduced, and film formation can be carried out under lower gas pressure as compared to an ordinary planar magnetron sputtering system.

In the apparatus of FIG. 5, the inner wall of the sputtering chamber 502, in which film formation is carried out, is subjected to electro polishing and chromium oxidation passivation (CRP) treatment to reduce gas emitted from the inner wall. The sputtering chamber 502 is provided with the load-lock chamber 501 via the all-metal gate valve 503. By this, the sputtering chamber 502 is not opened to the atmosphere at the time of setting the substrate body, so that the degree of vacuum can be maintained.

When a pump utilizing oil is employed in the vacuum pumping system, it is conjectured that cleanliness of the atmosphere and the surface of the substrate body is reduced owing to oil diffusion toward the load-lock chamber 501 and the sputtering chamber 502. Accordingly, all the pumps employed were oil-free pumps. To carry out vacuum pumping, a magnetic bearing type composite molecular pump (TG700M, made by Osaka Vacuum, Ltd.) 511, a molecular drag pump (made by Alcatel, Ltd.) 512, and a scroll vacuum pump (ISP-500, made by Iwata Air Compressor Mfg. Co., Ltd.) 513 were employed for the sputtering chamber 502.

And, for the load-lock chamber 501, were employed a magnetic bearing type turbo-molecular pump (ET300 made by Ebara Corp.) 505 and a scroll vacuum pump (ISP-500, made by Iwata Air Compressor Mfg. Co., Ltd) 506. As the sputtering gas, Ar gas having the impurity concentration of the order of ppt was used and introduced into the sputtering chamber 502 using an SUS pipe 521 processed by CRP treating. Impurity concentration at the use point was about 1 ppb. To control the Ar gas, were employed an automatic pressure regulator (not shown) and a mass flow controller (not shown), processed by CRP treatment at gas contact portions in their inner surfaces. Degree of vacuum of the sputtering chamber 502 was measured by a wide range ionization gauge (MIG-430, made by Anelva Co., Ltd.) 514 and a Pirani gauge (TM20, mady by Leybold Co., Ltd.) 515. Degree of vacuum of the load-lock chamber 501 was measured by a wide range ionization gauge (not shown).

FIG. 6 is a schematic cross section of the inside of the sputtering chamber 50 of FIG. 5, seen from above. By rotating the substrate body holder 602 located in the center of the sputtering chamber, it is possible to form a multi-layer film on the substrate body 601. The distance between the targets was set at 100 mm, and the distance between the center of the targets and the substrate body was set at 90 mm. Further, since the plasma focus magnetic field is applied perpendicularly to a target, there is a leakage field of about 30 Oe in the plane of the substrate body at the position of the surface of the substrate body. The permanent magnets 608 or 610 are arranged in order that the leakage field at the position of the surface of the substrate body is in the same direction even when the substrate body 601 is rotated at the time of film formation. Rotation of the substrate body holder 602 and opening and closing of the shutter 605a or 605b are controlled by stepping motors (not shown) via rotating feed-throughs (not shown).

| (Symbols) | |
|---|---|
| 501 | load-lock chamber |
| 502 | sputtering chamber |
| 503 | gate valve |
| 504 | means for moving a substrate body |
| 505 | turbo-molecular pump |
| 506 | scroll vacuum pump |
| 507 | auxiliary valve |
| 508 | leak valve |
| 509 | variable leak valve |
| 510 | high purity $N_2$ gas supply line |
| 511 | composite molecular pump |
| 512 | molecular drag pump |
| 513 | scroll vacuum pump |
| 514 | ion gauge |
| 515 | Pirani gauge |
| 516 | auxiliary valve |
| 517, 518 | leak valves |
| 519 | variable leak valve |
| 520, 521 | high purity Ar gas supply lines |
| 601 | substrate body |
| 602 | substrate body holder |
| 603 | Co deposition chamber |
| 604 | Cu deposition chamber |
| 605 | shutter |
| 606 | anti-adhesion plate |
| 607 | Co target |
| 608 | magnet |
| 609 | Cu target |
| 610 | magnet |
| 611 | AC power supply |
| 612, 613 | DC power supplies |
| 614, 615 | cathodes |

BEST MODES FOR CARRYING OUT THE INVENTION

In the following, the present invention will be described referring to embodiments, although the present invention is not limited to these embodiments.

Embodiment 1

In the present embodiment, a magneto-resistance element of a structure in which ferromagnetic layers consisting of Co are laminated a plurality of times on a surface of a substrate body putting non-magnetic layers consisting of Cu therebetween is manufactured in the steps of:

(1) depressurizing an inside of a deposition chamber in which Cu layers and Co layers are formed to an ultimate degree of vacuum at a level of $10^{-9}$ Torr or less; then (2) introducing the atmosphere as the gas a containing at least oxygen or water into the deposition chamber by proper quantity to set the pressure at a level of $10^{-9}$ Torr—a level of $10^{-4}$ Torr, and further, introducing the gas b consisting of Ar to hold the pressure inside the deposition chamber at 3 mTorr, and carrying out plasma etching processing of the surface of the above-mentioned substrate body using a mixed gas of these gases for a given period of time; and thereafter (3) introducing the mixed gas of the gas a and gas b into the deposition chamber to hold the pressure inside the deposition chamber at 5 mTorr, and sputtering a predetermined target to form the non-magnetic layers and the ferromagnetic layers by a sputtering technique on the substrate body that has been processed by the plasma processing.

Figure 5:
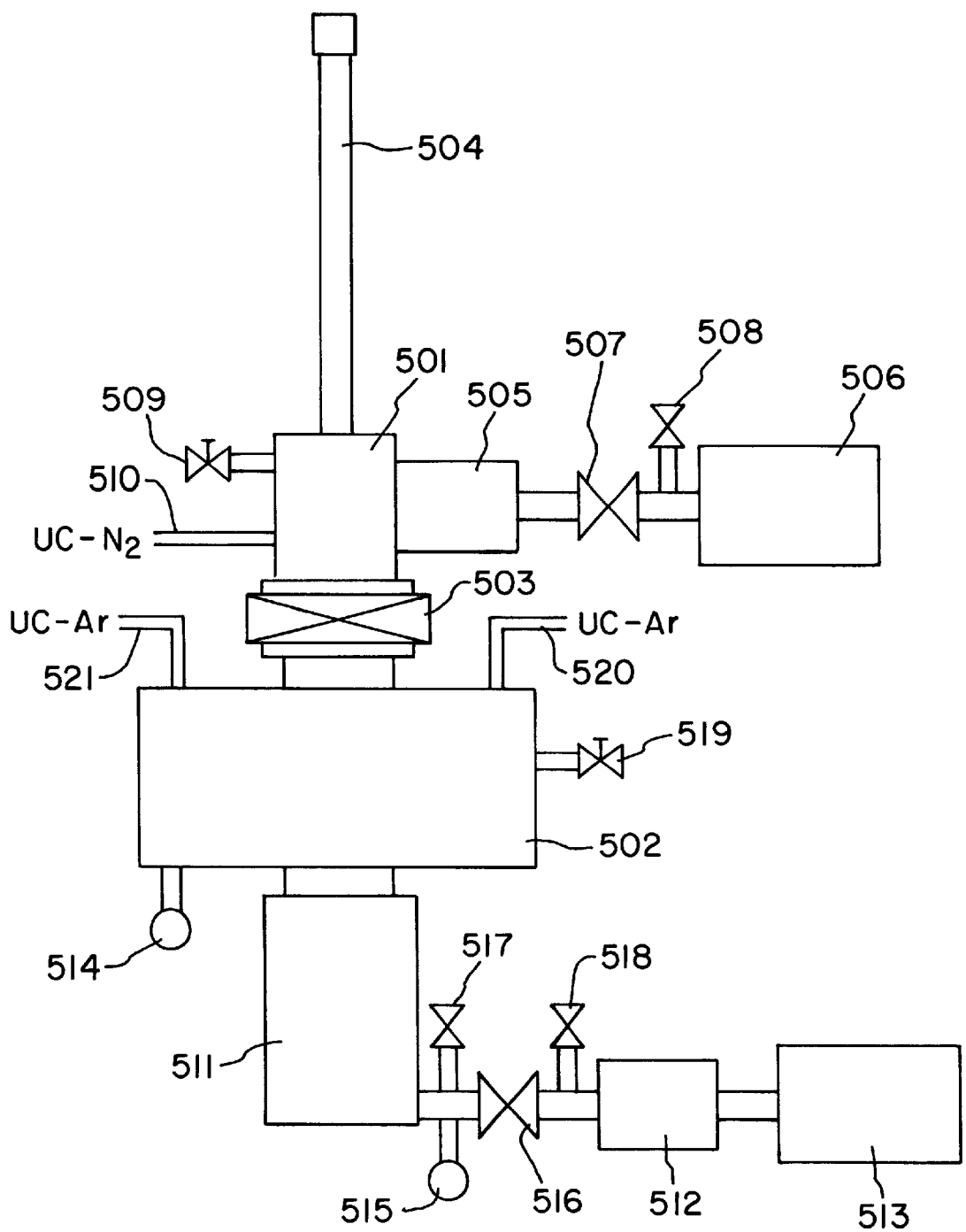
FIG. 5 is a diagram showing a vacuum pumping system of a film-formation apparatus suitable for carrying out the method of manufacturing a magneto-resistance element according to the present invention.
Figure 6:
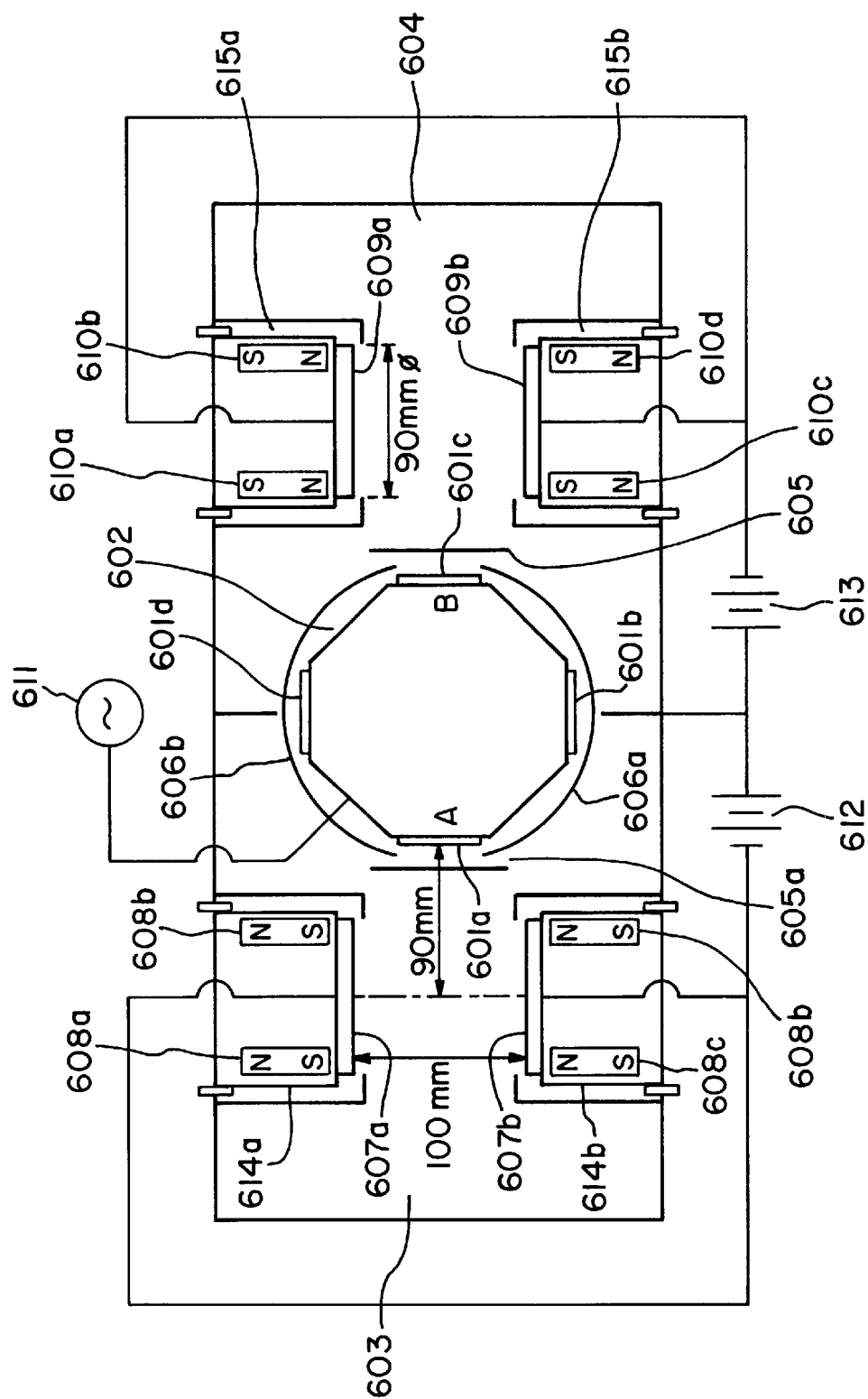
FIG. 6 is a schematic cross section of the inside of a sputtering chamber of the apparatus shown in FIG. 5, seen from above.

The above steps (1)–(3) were carried out using the facing target DC sputtering system shown in FIGS. 5 and 6.

Table 1 shows film formation conditions at the time of manufacturing the magneto-resistance element of the present embodiment.

TABLE 1

| Item | Set Value |
|---|---|
| Material of the substrate body | Si (100) single crystal |
| Size and shape of the substrate body | 2 inch φ |
| Surface roughness of the substrate body | 0.1 nm (Ra) |
| Ultimate degree of vacuum before etching processing | $2 \times 10^{-9}$ (fixed) |
| Etching processing conditions | |
| Etching gas | the atmosphere (gas a) + Ar (gas b) |
| Ultimate degree of vacuum after introduction of gas a (Torr) | $3.5 \times 10^{-9} - 2 \times 10^{-4}$ |
| Gas pressure at the time of etching processing (mTorr) = total pressure of gas a and gas b | 3 |
| Etching processing time (second) | 120 |
| Impurity concentration of Ar gas | 10 ppb or less ($H_2O$ < 1 ppb) |
| DC potential at the surface of the substrate body (V) | about −300 |
| Holding temperature at the surface of the substrate body (° C.) | 20 (the substrate body holder is water-cooled) |
| Film formation processing conditions | |
| Method of film formation | facing target DC sputtering technique |
| Target | Co (purity: 99.9%) Cu (purity: 99.999%) |
| Deposition gas | the atmosphere (gas a) + Ar (gas b) |
| Ultimate degree of vacuum after introduction of gas a (Torr) | $3.5 \times 10^{-9} - 2 \times 10^{-4}$ |
| Deposition gas pressure (mTorr) = total pressure of gas a and gas b | 5 |
| Impurity concentration of Ar gas | 10 ppb or less ($H_2O$ < 1 ppb) |
| Holding temperature at the surface of the substrate body (° C.) | 20 (the substrate body holder is water-cooled) |
| Deposition rate (nm/sec.) | 0.1 |
| Substrate bias | No |
| Film structure | Si(100)/(Co $d_{Co}$/Cu $d_{Cu}$)$_{N-1}$/Co $d_{Co}$/Cu 3 nm Film thickness of Co layer ($d_{Co}$) = 1.5 nm Film thickness of Cu layer ($d_{Cu}$) = 1.05 nm Times of lamination (N) = 30 |

In the following, the method of manufacturing the magneto-resistance element of the present embodiment will be described following the steps of the procedure. Numbers in parentheses indicate those steps.

(1) As the substrate body, was used a 2 inch wafer substrate of Si (100) single crystal. The surface roughness, i.e., center line average height Ra, of the substrate body was made to be 0.1 nm.

(2) The above-mentioned substrate body was subjected to cleaning treatment by mechanical and chemical methods and to drying treatment by hot air or the like, before film formation described below.

(3) The substrate body 601 processed by the above hot air treatment was set on the substrate body holder 602. The substrate body holder 602 set with this substrate body 601 was arranged on a substrate body support stand (not shown) in the load-lock chamber 501, and then, the load-lock chamber was depressurized.

(4) After the internal pressure of the load-lock chamber 501 arrived at the level of $10^{-8}$ Torr, the gate valve 503 was opened. Then, the means for moving the substrate body 504 was used to move the substrate body holder 602 set with the substrate body 601, from the load-lock chamber 501 into the sputtering chamber 502 that was kept in a depressurized state of the level of $10^{-9}$ Torr all the time. Thereafter, the gate valve 503 was closed.

The substrate body holder 602 is arranged in the central part of the sputtering chamber 502, and has a rotatable mechanism made of SUS.

Here, the central part refers to a space provided between a deposition space 1 for forming a Co film and a deposition space 2 for forming a Cu film, being defined by the shutters 605a, 605b, and the anti-adhesion plates 606a, 606b.

(5) The substrate body 601a to be etched was moved to the side of the Co deposition chamber 603, and the shutter 606 was opened.

(6) The atmosphere (gas a) was introduced into the sputtering chamber 502 through the leak valve 519. At that time, the ultimate degree of vacuum after the introduction was controlled to be a certain pressure within the range of $3.5 \times 10^{-9} - 2 \times 10^{-4}$ Torr.

(7) Further, Ar gas (gas b) was introduced into the sputtering chamber 502 at a suitable flow rate, and gas pressure at the time of etching (i.e., total pressure of the gas a and the gas b) was fixed at 3 mTorr. The substrate body 601 was positioned in the direction facing the deposition space 1 for forming a Co film (position A).

(8) The shutter 606 was opened, and RF bias was applied to the substrate body 601a via the substrate body holder 602 from the AC power supply 611, to generate arc on the surface of the substrate body 601a so that the surface of the substrate body 601a was etched.

Here, to generate seed plasma for causing the plasma arc on the surface of the substrate body, a discharging trigger (not shown) was used. Further, when the plasma was discharging on the surface of the substrate body, DC potential on the surface of the substrate body was about −300 V. The etching depth of the substrate body was fixed at 2 nm. Holding temperature of the surface of the substrate body was held at 20° C. by water-cooling the substrate body holder 502.

(9) Next, Ar gas (gas b) was introduced into the sputtering chamber 502 at a suitable flow rate, and gas pressure at the time of film formation (i.e., total pressure of the gas a and the gas b) was fixed at 5 mTorr.

(10) After the etching, arbitrary voltage was applied to the cathodes 614a, 614b, to which the Co targets were installed respectively, from the DC power supply 612, so as to generate plasma. Further, arbitrary voltage was applied to the cathodes 615a, 615b, to which the Cu targets were installed respectively, from the DC power supply 605, so as to generate plasma. By this, the Co targets 607a, 607b, and the Cu targets 609a, 609b were in the state of being sputtered.

(11) While maintaining the state of the above (10), the shutter 605a was opened, and a Co layer of film thickness 1.5 nm was formed on the surface of the substrate body 601a positioned in parallel with the center line of the Co targets 607a, 607b facing each other. The film thickness was controlled by the period of time during which the shutter 605a was opened.

(12) The substrate body holder 602 was turned by 180 degrees so that the substrate body 601a was moved to be positioned in the direction facing the deposition space 2 for forming a Cu film (position B).

(13) While maintaining the state of the above (10), the shutter 605 was opened, and a Cu layer of film thickness 1.05 nm was formed on the surface of the substrate body 601a which had been formed with the Co layer on its surface and was positioned in parallel with the center line of the Cu targets 609a, 609b facing each other. The film thickness was controlled by the period of time during which the shutter 605 was opened.

(14) Again, the substrate body holder 602 was turned to move the substrate body 601a to be positioned in the direction facing the deposition space 1 for forming a Co film again (position A).

(15) The above steps (11)–(15) were repeated 30 times, to manufacture a magneto-resistance element (sample a) having the layer structure shown in Table 1.

Further, according to the above-described steps, a plurality of samples α were manufactured varying the ultimate degree of vacuum after the introduction of the gas a in the range of $3.5 \times 10^{-9} - 2 \times 10^{-4}$ Torr.

Here, as the targets, ones having as small quantity of impurities as possible were used. The impurities of the targets for forming a Co film were Fe:80, Cu<100, Ni: 600, O:90, and N<10 (wt ppm).

COMPARATIVE EXAMPLE 1

The present example differs from Embodiment 1 in that the ultimate degree of vacuum is varied in the range of $2 \times 10^{-9} - 4 \times 10^{5}$ Torr, and the etching of the surface of the substrate body and the film formation processing of the Co layers and Cu layers are carried out using Ar gas only. The magneto-resistance element manufactured in the present example is referred to as a sample β.

In other points, the present example is similar to Embodiment 1.

Figure 1:
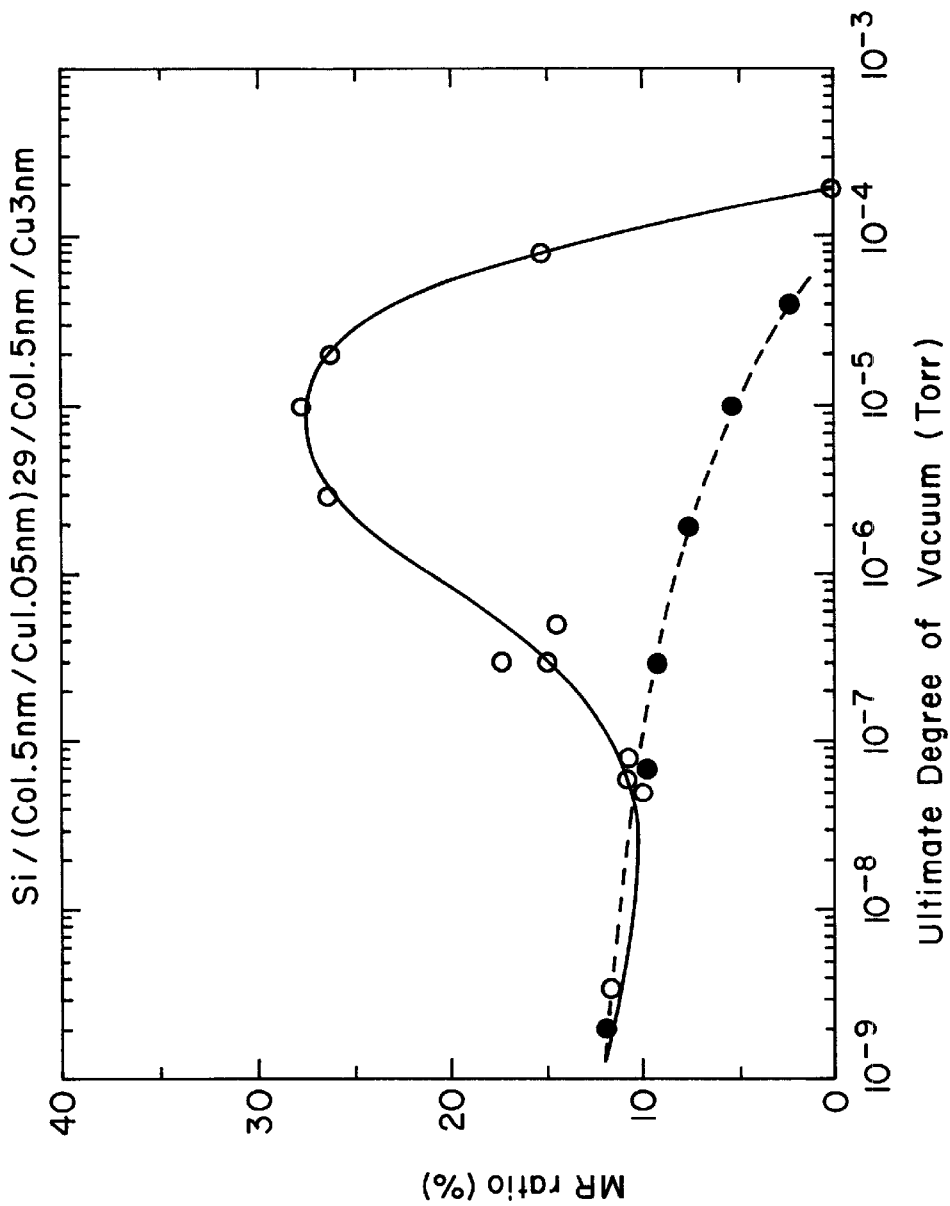
FIG. 1 is a graph showing a relation between an ultimate degree of vacuum of the sputtering chamber and an MR ratio of a magneto-resistance element manufactured.

FIG. 1 shows MR ratios of manufactured magneto-resistance elements, using a mark ○ (sample α) and a mark ● (sample β). The abscissa of FIG. 1 indicates an ultimate degree of vacuum of the deposition chamber, and, in particular, the ultimate degree of vacuum after the introduction of the gas a in the case of the sample α. The ordinate of FIG. 1 indicates an MR ratio measured by the DC four-terminal method. At the time of measurement, a magnetic field H (maximum applied magnetic field=13 kOe) was applied in parallel with a film surface of the above structure and perpendicularly to electric current flowing through the magneto-resistance element.

From FIG. 1, the following experimental results are obtained.

(1) In the sample β corresponding to the conventional case, as the ultimate degree of vacuum of the deposition chamber decreases, the MR ratio becomes higher.

In the sample β at $2 \times 10^{-9}$ Torr, an MR ratio of 12% was obtained.

(2) In the sample α according to the present invention, as the ultimate degree of the deposition chamber decreases, the MR ratio tends to be higher.

(3) In particular, when, among the manufacturing conditions of the sample α, the ultimate degree of vacuum after the introduction of the gas a is more than or equal to $3 \times 10^{-7}$ Torr and less than or equal to $8 \times 10^{-5}$ Torr in the step of carrying out the plasma etching processing and in the step of forming a film by the sputtering technique, then, there is obtained a magneto-resistance element having a higher MR ratio than the sample β at $2 \times 10^{-9}$ Torr that indicates the maximum MR ratio among the conventional examples.

(4) Further, in the case that, among the manufacturing conditions of the sample α, the ultimate degree of vacuum after the introduction of the gas a is more than or equal to $3 \times 10^{-6}$ Torr and less than or equal to $2 \times 10^{-5}$ Torr in the step of carrying out the plasma etching processing and in the step of forming a film by the sputtering technique, then, there is obtained a magneto-resistance element having such a superior MR ratio as more than twice the maximum of the MR ratio (of the sample β at $2\times10^{-9}$ Torr) in the conventional case.

Figure 2:
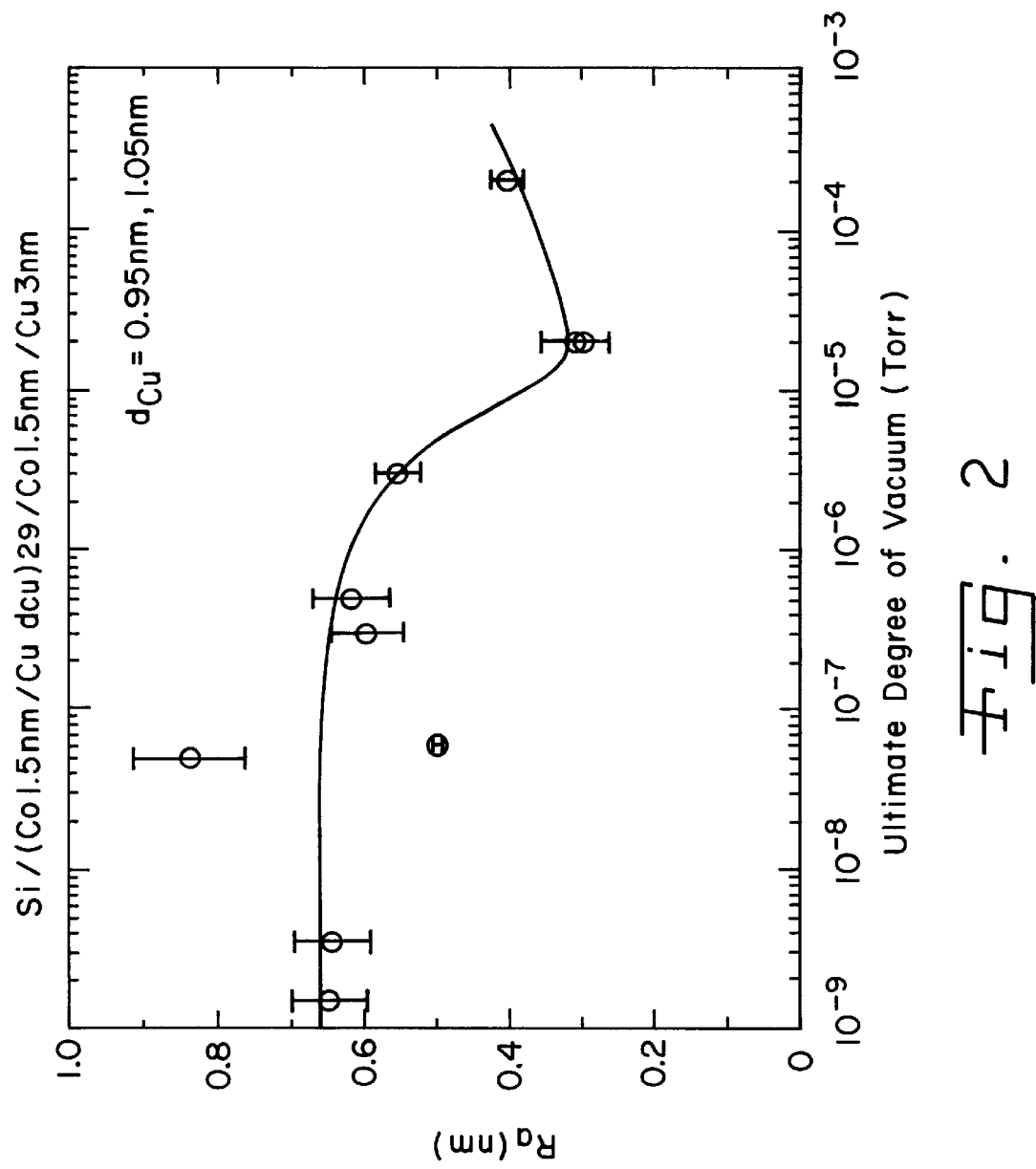
FIG. 2 is a graph showing a relation between an ultimate degree of vacuum of the sputtering chamber and roughness of the uppermost surface of a magneto-resistance element.

FIG. 2 is a graph showing a result of investigating roughness (center line average height: Ra [nm]) of the uppermost surface by an atomic force microscope (AFM), for samples α manufactured varying ultimate degree of vacuum in embodiment 1.

From FIG. 2, it is found that the roughness of the uppermost surface of the sample α becomes small at the ultimate degree of vacuum after the introduction of the gas a at which a high MR ratio is obtained. It is considered that, since the atmosphere used as the gas a contains oxygen ($O_2$), surfaces of crystal grains constituting the Co layers and the Cu layers or their intergranular parts are oxidized to cause such reduction in the surface roughness.

Namely, in the sample α indicating a superior magnetic characteristic of the high MR ratio (i.e., in the case that the ultimate degree of vacuum after the introduction of the gas a is more than or equal to $7\times10^{-7}$ Torr and less than or equal to $8\times10^{-5}$ Torr), it is considered that oxidization does not proceed up to the insides of the crystal grains, and the crystal grains constituting the ferromagnetic layers are in the form like islands separated by oxygen. However, in the sample a having a largely-reduced MR ratio (i.e., in the case that the ultimate degree of vacuum after the introduction of the gas a is $2\times10^{-4}$ Torr), it is conjectured that oxidization proceeds to the insides of the crystal grains, thus causing deterioration of an MR ratio.

Figure 3:
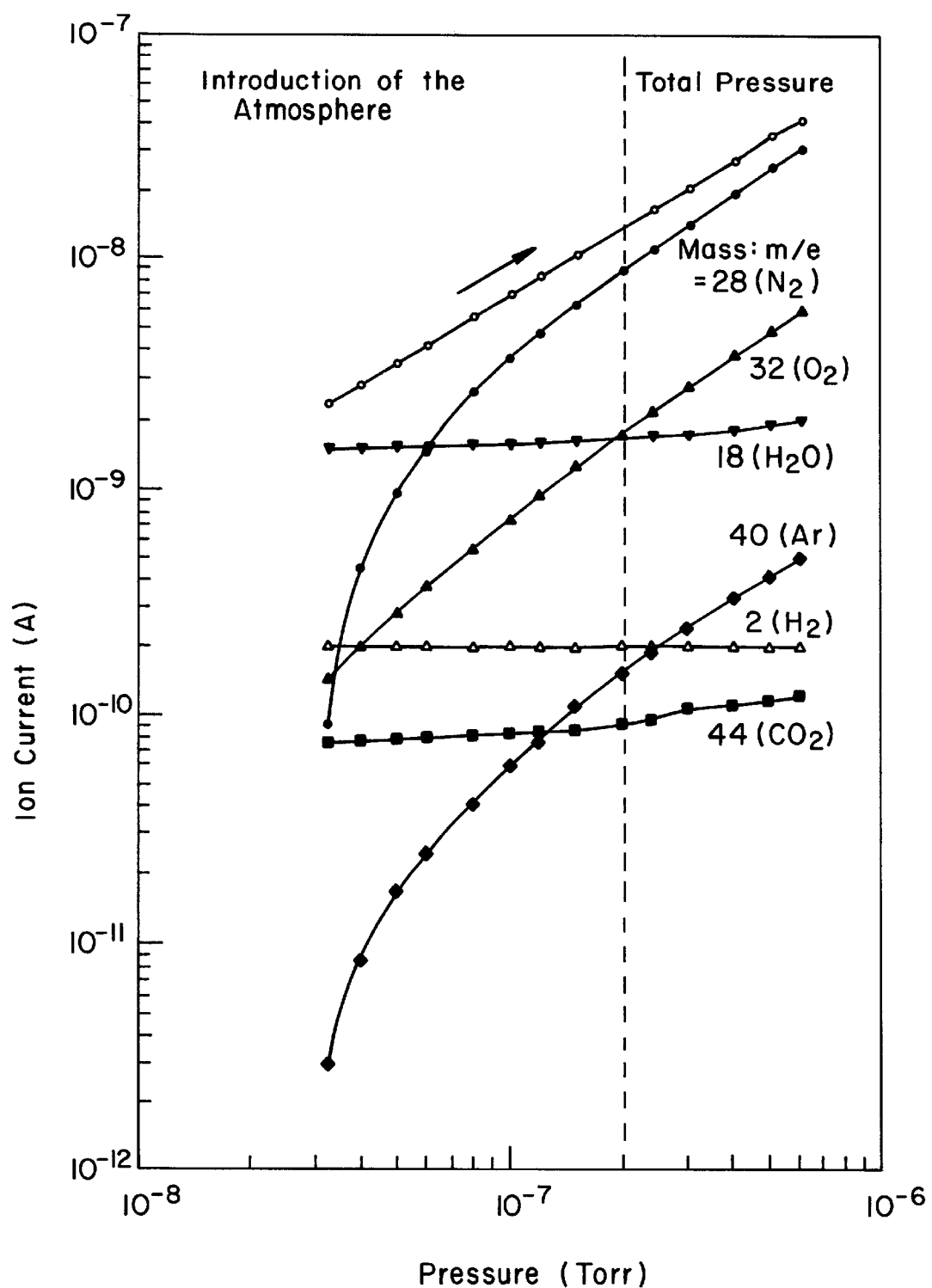
FIG. 3 is a graph showing a result of measuring an atmosphere inside the sputtering chamber using a quadrupole mass spectrometer when the gas a consisting of the atmosphere is introduced in the step of carrying out the plasma etching and in the step of the film formation by a sputtering technique.

FIG. 3 shows a result of measuring an atmosphere inside the sputtering chamber by a quadrupole mass spectrometer in the case that the gas a consisting of the atmosphere is introduced in the step of carrying out the plasma etching processing and in the step of forming a film by the sputtering technique.

From FIG. 3, it is found that, as the quantity of the atmosphere introduced into the sputtering chamber is increased, nitrogen ($N_2$), oxygen ($O_2$) and water ($H_2O$) are mainly increased inside the sputtering chamber.

COMPARATIVE EXAMPLE 2

The present example differs from Embodiment 1 in that the gas a introduced in the step of carrying out the plasma etching processing and in the step of forming a film by the sputtering technique is changed from the atmosphere to nitrogen (N2) gas. The magneto-resistance element manufactured in the present example is referred to as a sample γ.

In other points, the present example is similar to Embodiment 1.

The magneto-resistance elements (samples γ) manufactured changing the gas a from the atmosphere to nitrogen ($N_2$) gas do not show such an increasing tendency of MR ratios as in the samples α t obtained in Embodiment 1 (marks ○ in FIG. 1), but show an increasing-decreasing tendency of MR ratios similar to the samples β in Embodiment 1 (marks ● in FIG. 1).

Figure 4:
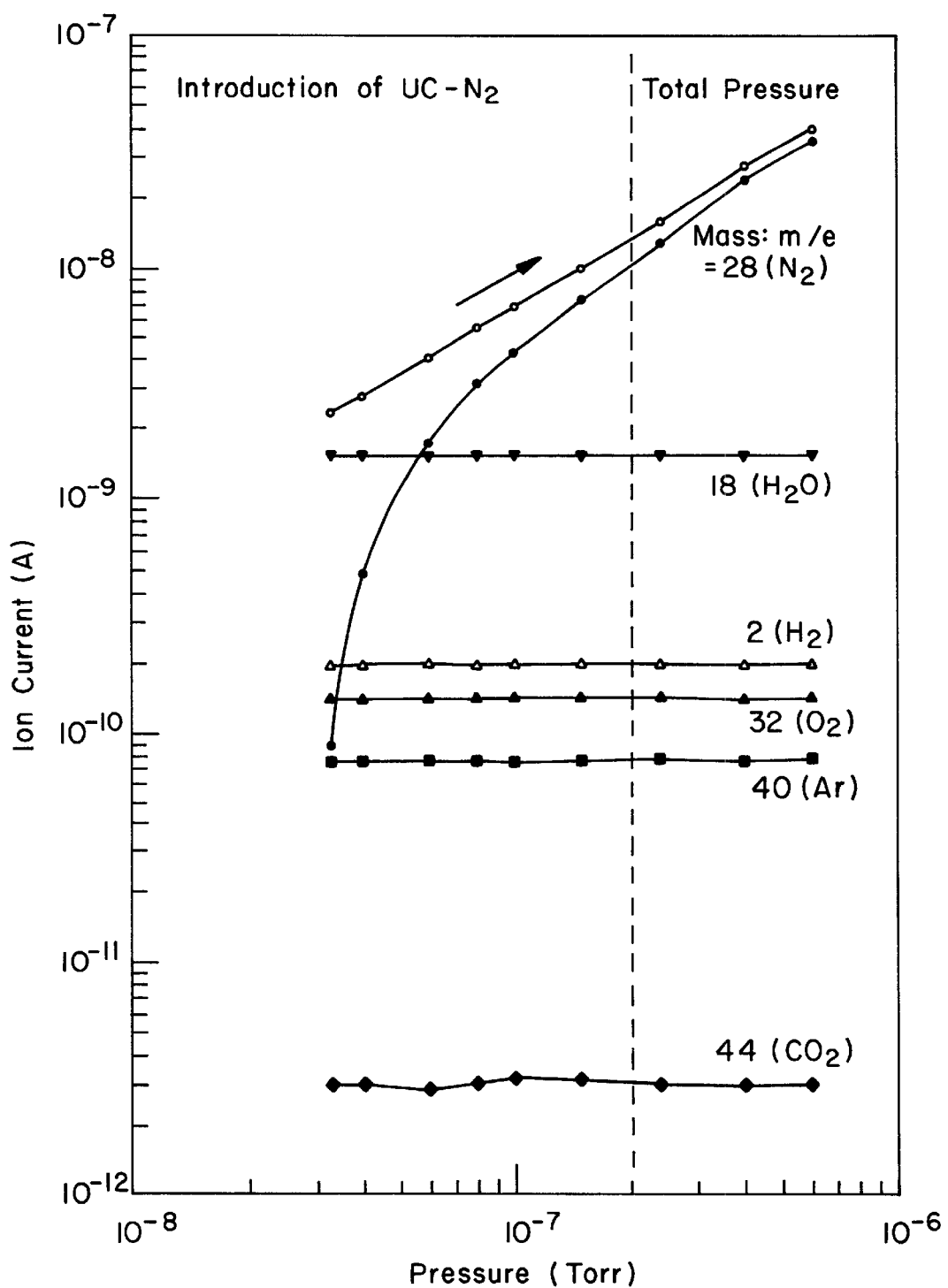
FIG. 4 is a graph showing a result of measuring an atmosphere inside the sputtering chamber using a quadrupole mass spectrometer when the gas a consisting of nitrogen ($N_2$) gas is introduced in the step of carrying out the plasma etching and in the step of the film formation by a sputtering technique.

FIG. 4 shows a result of measuring an atmosphere inside the sputtering chamber by a quadrupole mass spectrometer in the case that the gas a consisting of nitrogen ($N_2$) gas is introduced in the step of carrying out the plasma etching processing and in the step of forming a film by the sputtering technique.

From FIG. 4, it is found that, as the quantity of nitrogen ($N_2$) gas introduced into the sputtering chamber is increased, only nitrogen ($N_2$) is increased by the same degree as in FIG. 3 in the sputtering chamber.

From the above results, it is found that the effect of introducing the atmosphere as the gas a in Embodiment 1 is not the effect of nitrogen ($N_2$) gas contained in the atmosphere. In other words, it is considered that the effect of the introduction of the atmosphere in Embodiment 1 is the effect of introducing at least oxygen ($O_2$) and water ($H_2O$).

Further, also in Comparative Embodiment 1, the atmosphere corresponding to each ultimate degree of vacuum is contained. However, it is also found that residual quantity of water ($H_2O$) is larger than Embodiment 1 by one digit or more.

Thus, it is found that, only when the method of manufacturing a magneto-resistance element according to the present invention, shown in Embodiment 1, is employed, i.e., only when a controlled quantity of gas a containing at least oxygen ($O_2$) and water ($H_2O$) is introduced into an ultra clean space, it is possible to obtain a magneto-resistance element having a high MR ratio.

Industrial Applicability

As described above, according to the present invention, it is possible to obtain a method of manufacturing a magneto-resistance element that has a high MR ratio and can reproduce a magnetic signal with higher sensitivity.

By using the method of manufacturing a magneto-resistance element according to the present invention, it is also possible to stably manufacture an MR head adaptable to promotion of higher recording density.

What is claimed is:

1. A method of manufacturing a magneto-resistance element of a structure in which ferromagnetic layers are laminated a plurality of times on a surface of a substrate body putting non-magnetic layers therebetween, comprising steps of:

depressurizing an inside of a deposition chamber in which said non-magnetic layers and said ferromagnetic layers are formed to an ultimate degree of vacuum at a level of $10^{-9}$ Torr or less;

introducing a gas a containing at least oxygen or water into said deposition chamber to change the ultimate degree of vacuum inside the deposition chamber to a certain pressure higher than the level of $10^{-9}$ Torr, then, introducing a gas b consisting of Ar, and carrying out plasma etching processing of the surface of said substrate body using a mixed gas of said gas a and said gas b, and sputtering prescribed targets in said deposition chamber using the mixed gas of said gas a and said gas b to form said non-magnetic layers and said ferromagnetic layers by a sputtering technique on the substrate body processed by said plasma processing.

2. A method of manufacturing a magneto-resistance element according to claim 1, wherein:

the ultimate degree of vacuum of the deposition chamber after the introduction of said gas a is more than or equal to $3\times10^{-7}$ Torr and less than or equal to $8\times10^{-5}$ Torr in said step of carrying out the plasma etching processing and in said step of forming the layers by the sputtering technique.

3. A method of manufacturing a magneto-resistance element according to claim 1, wherein:

the ultimate degree of vacuum of the deposition chamber after the introduction of said gas a is more than or equal to $3\times10^{-6}$ Torr and less than or equal to $2\times10^{-5}$ Torr in said step of carrying out the plasma etching processing and in said step of forming the layers by the sputtering technique.

* * * * *